US006010918A

United States Patent [19]

Marino et al.

[11] Patent Number: 6,010,918

[45] Date of Patent: Jan. 4, 2000

[54] GATE ELECTRODE STRUCTURE FOR FIELD EMISSION DEVICES AND METHOD OF MAKING

[75] Inventors: Jeffrey R. Marino, Fishkill; Joseph K. Ho, Wappingers Falls, both of N.Y.

[73] Assignee: FED Corporation, Hopewell Junction, N.Y.

[21] Appl. No.: 09/021,317

[22] Filed: Feb. 10, 1998

[51] Int. Cl.[7] ........................ H01L 21/00

[52] U.S. Cl. ........................ 438/20; 445/24; 445/35; 445/47; 445/49; 445/50; 445/51; 313/293; 313/309; 313/310; 313/311; 313/336

[58] Field of Search ........................ 438/20; 313/293, 313/309, 310, 311, 336; 445/24, 35, 47, 49, 50, 51

[56] References Cited

U.S. PATENT DOCUMENTS 3,998,678 12/1976 Fukase et al. .
5,504,385 4/1996 Jin et al. .
5,534,743 7/1996 Jones et al. .
5,578,900 11/1996 Peng et al. .
5,588,894 12/1996 Jin et al. .
5,616,368 4/1997 Jin et al. .
5,656,525 8/1997 Lin et al. .

*Primary Examiner*—John F. Niebling
*Assistant Examiner*—David A. Zarneke
*Attorney, Agent, or Firm*—Collier, Shannon, Rill & Scott, PLLC

[57] ABSTRACT

Field emission devices may include emitter wells formed in a body of dielectric material. A gate conductor may be provided along the upper surface of the dielectric material. A gate hole may be provided in the gate conductor directly above each of the emitter wells. A method for forming the gate holes and emitter wells is disclosed. The method includes the steps of providing a first gate conductor layer on a dielectric layer. A pattern of second gate conductor material may be formed over the first gate conductor layer, said pattern defining gate holes in the second gate conductor material. The gate holes may then be completed and emitter wells formed by etching through the first gate conductor layer and into the dielectric layer using an etch that selectively etches the first gate conductor layer and the dielectric layer, and does not etch substantially the second gate conductor material.

10 Claims, 4 Drawing Sheets

GATE ELECTRODE STRUCTURE FOR FIELD EMISSION DEVICES AND METHOD OF MAKING

FIELD OF THE INVENTION

The present invention relates to field emission devices, and particularly to the gate conductor of such devices. The invention also relates to methods of making such field emission devices.

BACKGROUND OF THE INVENTION

Microminiature field emission devices are well known in the microelectronics art. These microminiature field emission devices are finding widespread use as electron sources in microelectronic devices. For example, these devices may be used as electron guns in flat panel displays for use in aviation, automobiles, workstations, laptops, head wearable displays, heads up displays, outdoor signage, or practically any application for a screen which conveys information through light emission. Field emission devices may also be used in non-display applications such as power supplies, printers, and X-ray sensors.

When used in a display, the electrons emitted by a field emission device are directed to a cathodoluminescent material. These display devices are commonly called Field Emitter Displays (FEDs). The electrical theory underlying the operation of a FED is similar to that for a conventional CRT. Electrons supplied by a cathode (i.e. base conductor) are emitted from many microtips in the direction of the display surface. The emitted electrons strike phosphors on the inside of the display which excites the phosphors and causes them to momentarily luminesce. An image is produced by the collection of luminescing phosphors on the inside of the display screen. This process is a very efficient way of generating a lighted image.

In a CRT, a single electron gun is provided to generate all of the electrons which impinge on the display screen. A complicated aiming device, usually comprising high power consuming electromagnets, is required in a CRT to direct the electron stream towards the desired screen pixels. The combination of the electron gun and aiming device behind the screen necessarily make a CRT display prohibitively bulky.

FEDs, on the other hand, may be relativelv thin. Each pixel of an FED has its own electron source, typically an array or grouping of emitting microtips. The FEDs are thin because the microtips, which are the equivalent of an electron gun in a CRT, are extremely small. Further, an FED does not require an aiming device, because the electron guns (i.e. the array of microtips) for each pixel are positioned directly behind the screen. The microtips need only be capable of emitting electrons in a direction generally normal to the FED substrate.

As referenced above, a field emission device used in a display may include a microelectronic emission surface, also referred to as a "tip" or "microtip", to enhance electron emissions. Conical, pyramidal, curved and linear pointed tips are often used. Alternatively, a flat tip of low work function material may be provided. The tip may be disposed in a dielectric well that has approximately the same height as the tip. A base conductor may make electrical contact with the bottom of the tip at the base of the well. An extraction electrode or "gate conductor" may be provided along the upper rim of the well, adjacent, but not touching, the field emission tip, to form an electron emission gap therebetween. Upon application of an appropriate voltage between the base conductor and the gate, quantum mechanical tunneling, or other known phenomena, cause the tip to emit electrons. In microelectronic applications, an array of field emission tips may be formed in wells on the horizontal face of a substrate, such as a silicon semiconductor substrate, glass plate, or ceramic plate. Base conductors, gates and other electrodes may also be provided on or in the substrate as necessary. Support circuitry may be fabricated on or in the substrate.

The FEDs may be constructed using various techniques and materials, which are only now being perfected. There are two predominant processes for making field emission devices; "well first" processes, and "tip first" processes. In well first processes, such as a Spindt process, wells are first formed in a material, and tips are later formed in the wells. In tip first processes, the tips are formed first, and the wells are formed around the tips. There are multitudes of variations of both the well first and the tip first processes. The present invention relates primarily to a well first process.

The production of field emission devices using well first processes may require etching the wells into the device. With reference to FIG. 1, an emission array 10 of an FED may be constructed from a multi-layered structure having a bottom substrate 205 with a base conductor 200 formed thereon, a dielectric layer 210 formed on the base conductor 200, and a gate conductor 220 overlying the dielectric layer 210. The gate conductor material used may include materials such as Nb. The substrate 205 may be a glass substrate with layers of metal and insulator deposited thereon to form the base conductor 200 and dielectric layer 210, respectively. Alternatively, the base conductor 200 and dielectric layer 210 may be formed from a silicon wafer having an upper layer of $SiO_2$ formed therein to provide the dielectric layer.

Emitter wells may be formed in the emission array 10 by providing the gate conductor 220 with a gate hole using a photoresist masking and reactive ion etching (RIE) process on the gate conductor. The photoresist masking process requires that a layer of photoresist 230 be applied to and substantially cover the Nb gate conductor 220. Following an exposure process, the portion of the photoresist layer that is directly above the area where the gate hole is to be formed may be removed so that a hole 232 is formed in the photoresist mask.

With reference to FIG. 2, following the formation of the hole in the photoresist mask, the gate hole 222 may be etched into the gate conductor 220. The thickness of the gate conductor 220 that is used may be limited by the etch's ability to selectively etch the gate conductor and not etch the photoresist mask 230. A thick gate conductor 220 may be advantageous in some applications because it may increase the chance that the emitter tip that is formed later will be in the plane of the gate conductor. Using the above-referenced process, however, if the gate conductor 220 is too thick, the photoresist mask 230 may be etched away before etching through the gate conductor is completed. If the photoresist mask is etched away, the shape and size of the gate hole 222 may be affected undesirably.

Following the formation of the gate hole 222, the dielectric layer 210 may be selectively etched using a chemical etch or RIE to form an emitter well 212 in the dielectric layer. If the dielectric layer 210 is thicker than a predetermined limit, the photoresist mask 230 may be etched away before etching through the dielectric layer is completed. Etching away of the photoresist mask 230 before completion of the etching through the gate conductor 220 and the etching through the dielectric layer 210 may undesirably affect the size and shape of the gate hole 222 and the emitter well 212 that are produced. Degradation of the size and shape of the gate hole and the emitter well as a result of photoresist erosion may be particularly problematic when attempting to make these structures with substantially vertical sidewalls. Photoresist erosion during etching may also make it difficult or impossible to form gate holes and emitter wells with relatively small diametrical dimensions (e.g. 1 micron or less).

The foregoing method of forming emitter wells is also complicated by the fact that it requires two separate and distinct etching steps. A first etching step is required to etch the gate hole 222 into the gate conductor 220 and a second etching step is required to remove dielectric material under the gate hole 222 to form the emitter well 212.

After the gate hole 222 and emitter well 212 are formed, the photoresist layer 230 may be stripped off the device. The photoresist layer must be stripped before the FED is sealed because organic materials, such as photoresist, may outgas significantly over time within the FED. The occurrence of outgassing after an FED is completed and sealed can be catastrophic to the operation of the FED.

Although it is necessary, stripping the photoresist layer undesirably exposes the gate conductor 220 along its entire upper surface. Exposing the upper surface of the gate conductor 220 may present a problem in particular when Nb, or similar types of gate conductors, are used in an FED. The exposed surface of Nb or similar material may corrode during the heating cycles associated with processing and sealing the FED after the gate holes and emitter wells are formed.

It is evident from the foregoing that there is a need for an etch mask useful for the formation of gate holes and emitter wells that does not erode as quickly as photoresist or other organic material etch masks. There is also a need for an etch mask that may protect a FED gate conductor from exposure to corrosive processing and sealing steps during the manufacture the FED. Further, there is a need for an etch mask that enables the production of FED's with thicker gate conductors and thicker dielectric layers. Still further, there is a need for a method of forming gate holes and emitter wells that will require fewer distinct etching steps.

OBJECTS OF THE INVENTION

It is therefore an object of the present invention to provide a method of forming gate holes and emitter wells in a field emission device using an etch mask that may also serve as a gate conductor.

It is another object of the present invention to provide a field emission device with a common element that may serve as an etch mask and a gate conductor.

It is a further object of the present invention to provide an etch mask for forming gate holes and emitter wells in a field emission device that does not need to be removed from the device before it is sealed.

It is still another object of the present invention to provide a method of field emission device formation that enables the production of devices with thicker gate conductors and thicker dielectric layers.

It is vet another object of the present invention to provide a method of field emission device formation that may require fewer distinct etching steps.

It is still yet another object of the present invention to provide an etch mask for forming gate holes and emitter wells in a field emission device that does not erode as quickly as photoresist etch masks.

It is yet a further object of the present invention to provide an upper layer of corrosion protection material on a gate conductor.

Additional objects and advantages of the invention are set forth, in part, in the description which follows and, in part, will be apparent to one of ordinary skill in the art from the description and/or from the practice of the invention.

SUMMARY OF THE INVENTION

In response to the foregoing challenge, Applicants have developed an innovative, useful and improved method of making emitter wells and gate electrodes in a field emission device by etching into adjacent layers of a first gate conductor material and a dielectric material, the improvement comprising the steps of: providing a layer of first gate conductor material overlying a layer of dielectric material; providing a pattern of second gate conductor material over the layer of first gate conductor material, said pattern defining gate holes in the second gate conductor material; and etching through the first gate conductor material and into the dielectric material using an etch that selectively etches the first gate conductor material and the dielectric material, and does not etch substantially the second gate conductor material, wherein the combination of (i) the pattern of second gate conductor material and (ii) the etched first gate conductor material forms a gate electrode in the device.

Applicants have also developed an innovative, useful and improved field emission device having a gate electrode overlying a dielectric layer and which is formed using a well-first process, the improvement comprising a gate electrode having distinct layers of upper and lower gate conductor material, wherein the upper gate conductor material provides a mask for etching through the lower gate conductor material and into the dielectric layer.

It is to be understood that both the foregoing general description and the following detailed description are exemplary and explanatory only, and are not restrictive of the invention as claimed. The accompanying drawings, which are incorporated herein by reference, and which constitute a part of this specification, illustrate certain embodiments of the invention, and together with the detailed description serve to explain the principles of the present invention.

DETAILED DESCRIPTION OF THE PREFERRED EMBODIMENTS

Figure 8:
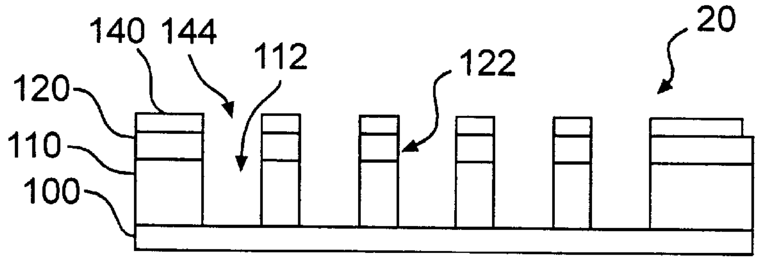

Reference will now be made in detail to a preferred embodiment of the present invention, an example of which is illustrated in the accompanying drawings. With reference to FIG. 8, a cross-sectional view in elevation of a completed field emission device 20 is shown. Field emission device 20 may include a base conductor 100 provided on a substrate (not shown). The substrate may be any material that is useful for providing structural support for the device. The base conductor may comprise Cr, Al, Cu, alloys of Cu/Al, Ge, Nb, Mo, Ti, W, Ta, Au, or Ag, and may be in the range of 0.1 to 20 microns thick. The base conductor 100 may comprise plural parallel elongated strips that run from side to side of the device 20. Each strip of the base conductor 100 may service a common line of emitters formed later on the strips.

Overlying the strips of the base conductor 100 may be a dielectric layer 110 that may insulate adjacent strips of the base conductor 100 from each other. The dielectric layer 110 may comprise SiO, $SiO_2$, $A_2O_3$, polyimide, SiN, etc., and is preferably $SiO_2$. The dielectric layer 110 may be in the range of 0.1 to 5 microns thick. The dielectric layer 110 may also have plural emitter wells 112 provided through the dielectric layer down to the base conductor 100. The emitter wells 112 may provide a location for the later formation of emitters (not shown).

Overlying the dielectric layer 110 may be a first gate conductor 120 that preferably comprises Nb material, but may be Ge, Re, Ta, W. Mo, Al, or any material that is conductive and etchable using RIE. The first gate conductor 120 may be provided in plural parallel strips that run substantially perpendicular to the run of strips of base conductor 100. The first gate conductor 120 may be in the range of 1,000 to 20,000 or more Angstroms thick, but is preferably approximately 4000 Angstroms thick. The first gate conductor 120 may have plural lower gate holes 122 provided therethrough above corresponding emitter wells 112.

Overlying the first gate conductor 120 may be a second gate conductor 140 that preferably comprises Cr material, but may be any material that provides high etch selectivity with the first gate conductor and good corrosion resistance, such as Ni, Co, Au, alloys, or intermetallic layers. The second gate conductor 140 may be provided in plural parallel strips in the range of 100 to 20,000 or more Angstroms thick that are substantially co-extensive with the strips of the first gate conductor 120. Plural upper gate holes 144 may be provided through the second gate conductor 140 above corresponding lower gate holes 122 in the first gate conductor 120.

The second gate conductor 140 may provide the dual function of enhancing the gate conductivity of the first gate conductor 120 and of providing an etch mask for etching the lower gate holes 122 through the first gate conductor 120 and the emitter wells 112 into the dielectric layer 110. Because the second gate conductor 140 may have a greater etch selectivity than a photoresist mask, thicker, narrower, and more closely spaced lower gate holes 122 and emitter wells 112 may be etched into the device 20. Thicker lower gate holes may increase display uniformity and emission in the device since more emitter tips are likely to be in the plane of the gate holes (the region of high field intensity that causes the tips to emit electrons). A first gate conductor 120 of increased thickness may also improve gate conductivity and response time. Devices that employ the second gate conductor 140 may also provide improved corrosion resistance of the first gate conductor 120 and gate leads. The inclusion of the second gate conductor as a corrosion barrier may eliminate the need for extra and expensive processes for passivating the first gate conductor 120 to protect it from the thermal cycles and atmospheric corrosion reactants that might otherwise damage the first gate conductor.

A preferred method of making a field emission device 20 of the present invention is illustrated by FIGS. 3–8. FIGS. 3–8 are cross-sectional views in elevation of a portion of the field emission device 20 which illustrate a step by step process for making the device, and in which like reference numerals refer to like elements.

Figure 1:
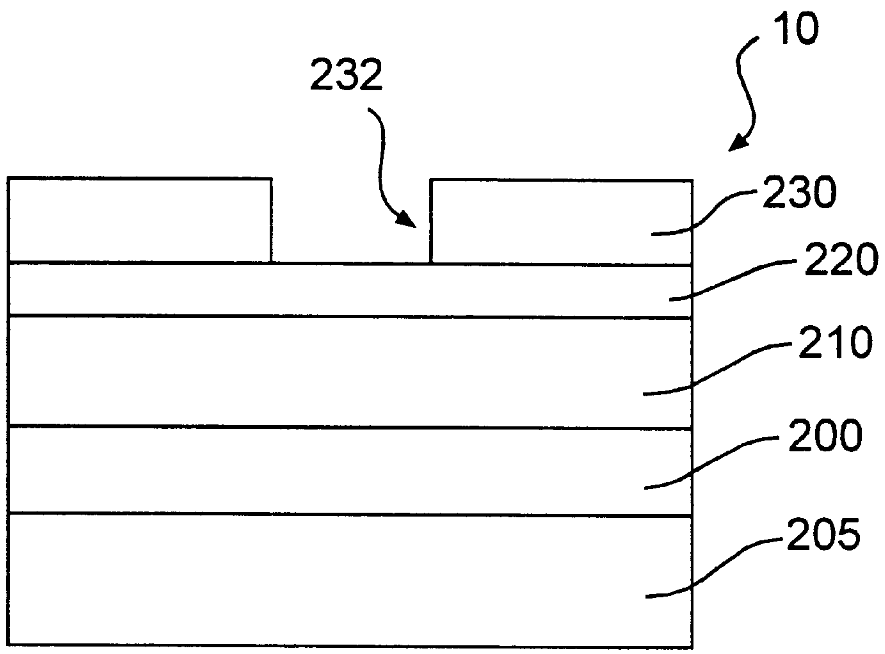
FIG. 1 is a cross-sectional view in elevation of a portion of a field emission device following the formation of an upper photoresist mask.
Figure 2:
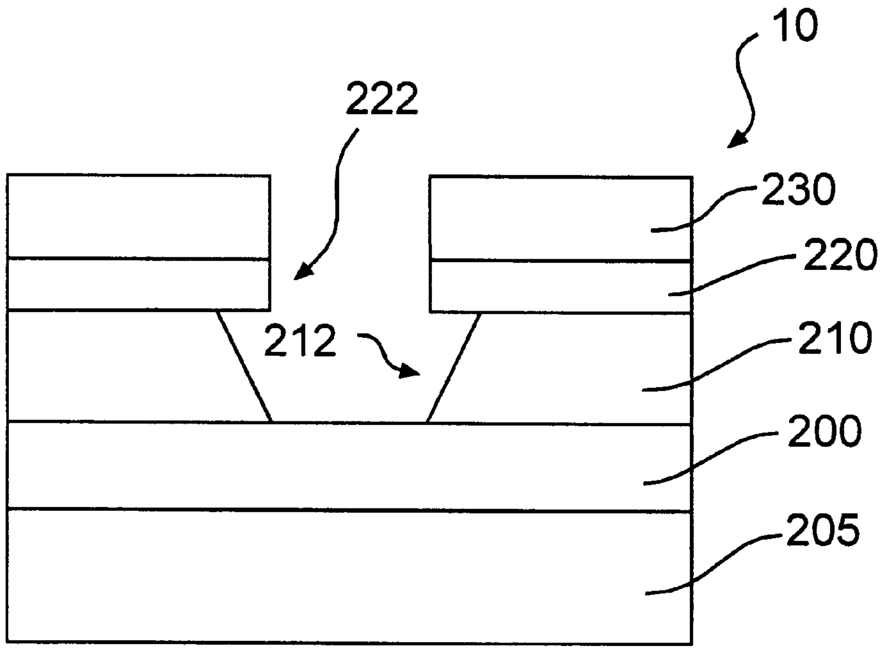
FIG. 2 is a cross-sectional view in elevation of the field emission device of FIG. 1 following the formation of a gate hole and an emitter well in the device.
Figure 3:
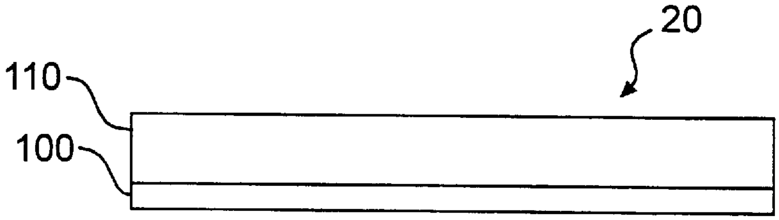
FIGS. 3–8 are cross-sectional views in elevation of a field emission device embodiment of the invention during sequential stages of processing.

With reference to FIG. 3, the process for making the field emission device 20 may be initiated with a multi-layered structure having a bottom substrate (not shown) with a base conductor 100 formed thereon and a dielectric layer 110 formed on the base conductor 100. The substrate may be a glass or silicon compound substrate with layers of metal and insulator deposited thereon to form the base conductor 100 and dielectric layer 110, respectively. Alternatively, the base conductor 100 and dielectric layer 110 may be formed from a unitary silicon wafer having an upper layer of $SiO_2$ formed therein to provide the dielectric layer.

Figure 4:
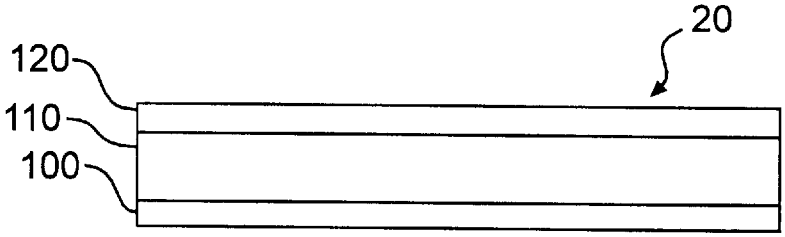

With reference to FIG. 4, a first gate conductor 120 may be formed overlying the dielectric layer 110. Preferably, a 4000 Angstrom thick layer of Nb may be sputtered onto the dielectric layer to provide the first gate conductor 120.

Figure 5:
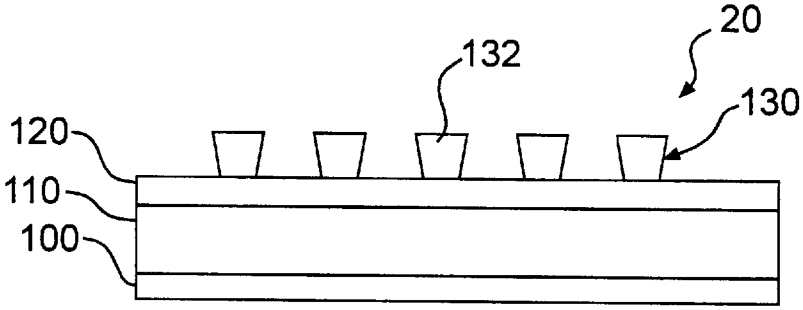

With reference to FIG. 5, a layer of photoresist material 130 may be provided on the first gate conductor 120. The photoresist material may be patterned and developed such that a pattern of photoresist dots 132 remain. More specifically, selective portions of the layer of photoresist material 130 may be exposed to light and the exposed portions removed such that the dots 132 of photoresist material remain over the layer of first gate conductor material. Alternatively, the non-exposed portions of photoresist material may be removed (depending upon whether positive or negative photoresist is used).

Figure 6:
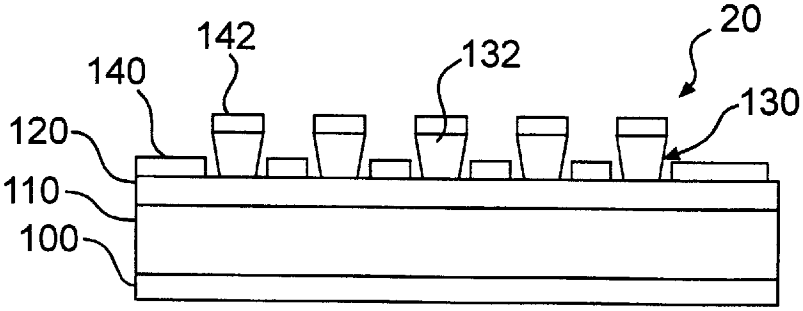

With reference to FIG. 6, a second gate conductor 140 layer of material may be provided on the first gate conductor 120 layer of material. Preferably, the second gate conductor 140 may comprise a 800–1500 Angstrom thick film of Cr that is evaporated at normal incidence to the device onto the exposed portions of the first gate conductor 120 and the upper surface of the photoresist dots 132. The second gate conductor 140 may be an integral strip of second gate conductor material that is interrupted by the dots 132 of photoresist material.

Figure 7:
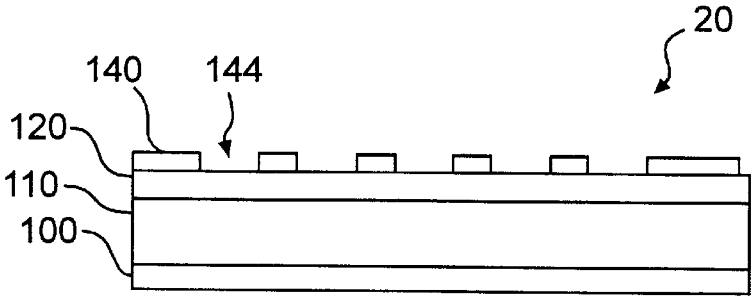

With reference to FIG. 7, the dots 132 of photoresist material may be removed such that a pattern of second gate conductor material is provided with upper gate holes 144 therein. The dots may be removed using a solvent or stripping solution (i.e. piranha). Removal of the dots 132 results in the portions 142 (FIG. 6) of the second gate conductor material on top of the dots being removed with the dots.

As noted above and with reference to FIG. 8, the remaining second gate conductor 140 may provide multiple functions of enhancing the gate conductivity of the first gate conductor 120, providing corrosion protection of the first gate conductor, and providing an etch mask for etching the lower gate holes 122 through the first gate conductor 120 and the emitter wells 112 into the dielectric layer 110. The lower gate holes 122 and the emitter wells 112 may be anisotropically etched in a reactive ion etcher using a suitable gas mixture (e.g. $CF_4/CHF_3/O_2$) to provide substantially straight sidewall holes in the first gate conductor 120. The anisotropic etch may also etch the dielectric layer 110 underneath the lower gate holes 122 to form the emitter well 112 with substantially straight sidewalls. The emitter wells 112 may then optionally be further etched briefly using an isotropic wet oxide etch to provide an undercut in the emitter wells 112 below the lower gate holes 122.

Following the formation of the emitter wells 112, field emitter tips may be formed in the wells using a Spindt technique or other compatible method for forming tips in a well first process.

Figure 9:
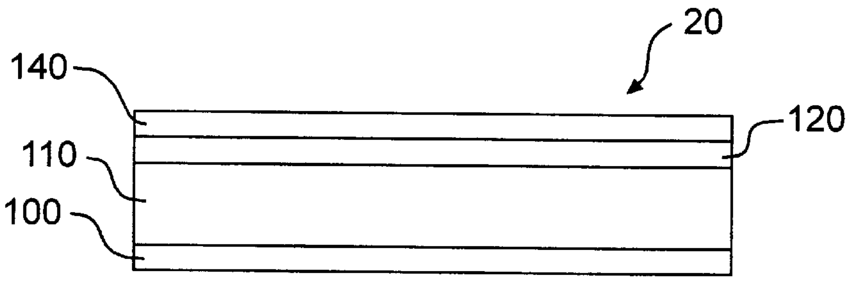
FIGS. 9–12 are cross-sectional views in elevation of a field emission device embodiment of the invention during alternative stages of processing to those of FIGS. 5–8.

Alternative process steps to those illustrated by FIGS. 5–8 are illustrated by FIGS. 9–12. The alternative process completed by the steps illustrated by FIGS. 9–12 may be initiated by the steps illustrated by FIGS. 3 and 4. With reference to FIG. 9, and starting with the structure of FIG. 4, a second gate conductor 140 layer of material may be provided on the first gate conductor 120 layer of material. Preferably, the second gate conductor 140 may comprise a 800–1500 Angstrom thick film of Cr that is evaporated at normal incidence to the device 20 onto the exposed upper surface of the first gate conductor 120. The second gate conductor 140 may be an integral strip of second gate conductor material that is substantially coextensive with the first gate conductor 120.

Figure 10:
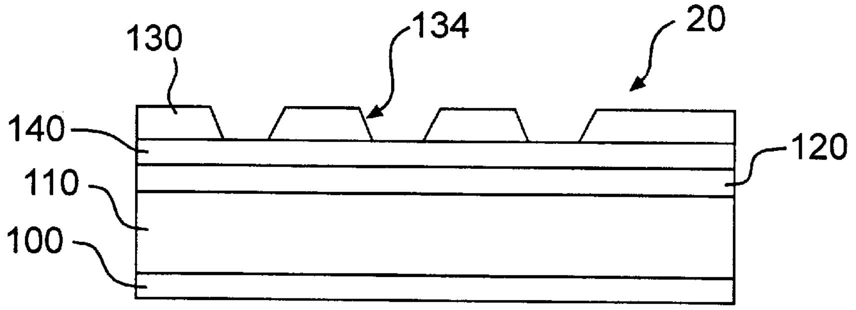

With reference to FIG. 10, a layer of photoresist material 130 may be provided on the second gate conductor 140. The photoresist material may be patterned and developed such that a pattern of photoresist holes 134 are provided in the material. More specifically, selective portions of the layer of photoresist material 130 may be exposed to light and the exposed portions removed such that the photoresist holes 134 are formed. Alternatively, the non-exposed portions of photoresist material may be removed (depending upon whether positive or negative photoresist is used).

Figure 11:
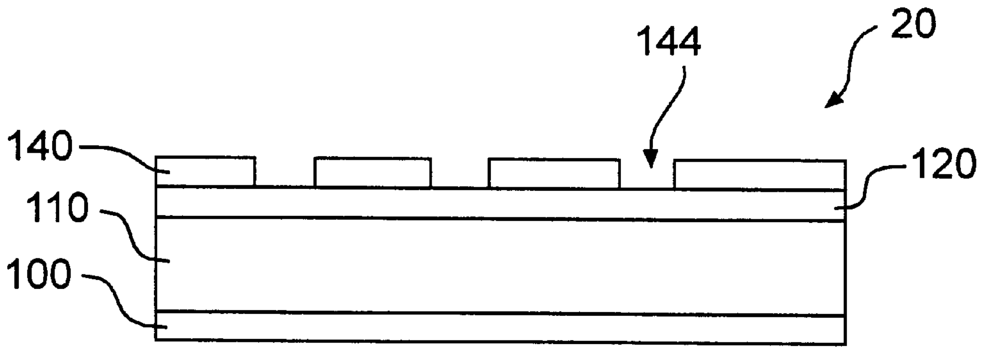

With reference to FIG. 11, the upper gate holes 144 may then be etched through the second gate conductor 140 using the photoresist material 130 as a mask and a selective etch for the second gate conductor material (e.g. ceric ammonium nitrate solution for a second gate conductor comprising Cr).

Figure 12:
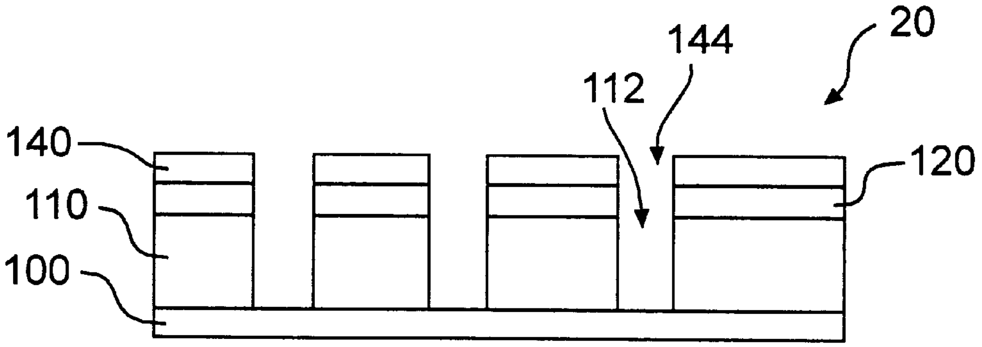

With reference to FIG. 12, following the formation of the upper gate holes 144 the remaining second gate conductor 140 may provide the functions of enhancing the gate conductivity and providing corrosion protection of the first gate conductor 120, and of providing an etch mask for etching the lower gate holes 122 through the first gate conductor 120 and the emitter wells 112 into the dielectric layer 110. The lower gate holes 122 and the emitter wells 112 may be anisotropically etched in a reactive ion etcher using a suitable gas mixture (e.g. $CF_4/CHF_3/O_2$) to provide substantially straight sidewall holes in the first gate conductor 120. The anisotropic etch may also etch the dielectric layer 110 underneath the lower gate holes 122 to form the emitter well 112 with substantially straight sidewalls.

Figure 13:
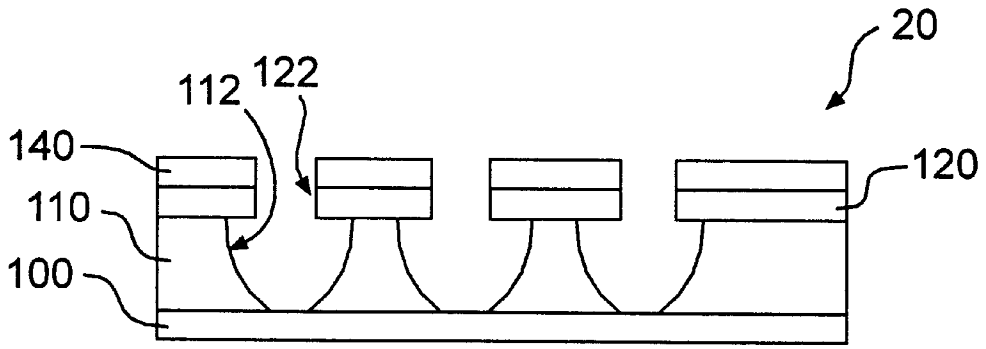
FIG. 13 is a cross-sectional view in elevation of an alternate embodiment of the field emission devices shown in FIGS. 8 and 12.

With reference to FIG. 13, the emitter wells 112 of the devices shown in FIGS. 8 and 12, optionally, may be further etched using an isotropic wet oxide etch to provide an undercut in the emitter wells 112 below the lower gate holes 122. An additional alternative may be to etch the emitter wells 112 entirely using an isotropic etch to provide a desired undercut in the dielectric layer 110.

It will be apparent to those skilled in the art that various modifications and variations can be made in the construction, configuration, and/or operation of the present invention without departing from the scope or spirit of the invention. For example, in the embodiments mentioned above, the first gate conductor may comprise other conductor materials that are RIE etchable or otherwise selectively anisotropically etchable, such as Ge, Re, Ta, W, and Mo. Alternate second gate conductors may comprise any material that provides high etch selectivity as between the first and second gate conductors and good corrosion resistance, such as Ni, Co, Au, alloys, and intermetallic layers. Alternate liftoff structures to the above-referenced photoresist layers may include composite structures of organic and inorganic layers, photo sensitive polyimides, and other materials capable of being patterned. Variations in the shapes and sizes of the emitters, gate conductors, base conductors, and emitter wells may also be made without departing from the scope and spirit of the invention. Further, it may be appropriate to make additional modifications or changes to the process for providing the second gate conductor without departing from the scope of the invention. Thus, it is intended that the present invention cover the modifications and variations of the invention provided they come within the scope of the appended claims and their equivalents.

We claim:

1. A method of making an emitter well in a field emission device comprising the steps of:

providing a multi-layered structure having a first gate conductor layer overlying a dielectric layer overlying a base conductor layer;

providing a pattern of photoresist material overlying the first gate conductor layer, thereby forming a pattern of exposed first gate conductor material;

providing a second gate conductor layer on the pattern of exposed first gate conductor material, said second gate conductor layer being interrupted by the pattern of resist material;

removing the pattern of resist material from the device; and forming a gate hole in the first gate conductor layer and an emitter well in the dielectric layer using an etch that selectively etches the first gate conductor layer and the dielectric layer, and does not etch substantially the second gate conductor layer.

2. The method of claim 1 wherein said first gate conductor layer comprises a material selected from the group consisting of: Nb, Ge, Re, Ta, W, Mo, and Al.

3. The method of claim 1 wherein said second gate conductor layer comprises a material selected from the group consisting of: Cr, Ni, Co, Au, alloys, and intermetallics.

4. The method of claim 3 wherein said first gate conductor layer comprises a material selected from the group consisting of: Nb, Ge, Re, Ta, W, Mo, and Al.

5. The method of claim 1 wherein said pattern of photoresist material comprises a pattern of dots of photoresist material.

6. The method of claim 1 wherein said etch comprises an anisotropic etch.

7. In a method of making emitter wells and gate electrodes in a field emission device by etching into adjacent layers of a first gate conductor material and a dielectric material, the improvement comprising the steps of:

providing a layer of first gate conductor material overlying a layer of dielectric material;

providing a pattern of second gate conductor material over the layer of first gate conductor material, said pattern defining gate holes in the second gate conductor material; and etching through the first gate conductor material and into the dielectric material using an etch that selectively etches the first gate conductor material and the dielectric material, and does not etch substantially the second gate conductor material, wherein the combination of (i) the pattern of second gate conductor material and (ii) the etched first gate conductor material forms a gate electrode in the device.

8. The method of claim 7, wherein the step of providing a pattern of second gate conductor material comprises the steps of:

providing a layer of second gate conductor material over the layer of first gate conductor material;

providing a photoresist layer over the layer of second gate conductor material;

removing selective portions of the photoresist layer to expose selective portions of the second gate conductor material; and selectively etching the exposed portions of the second gate conductor material to thereby provide the pattern of second gate conductor material.

9. The method of claim 7, wherein the step of providing a pattern of second gate conductor material comprises the steps of:

providing a layer of photoresist material over the layer of first gate conductor material;

exposing selective portions of the photoresist layer to light;

removing portions of the photoresist layer such that dots of photoresist material remain over the layer of first gate conductor material;

providing a layer of second gate conductor material on the layer of first gate conductor material, said layer of second gate conductor material being interrupted by the dots of photoresist material; and removing the dots of photoresist material to thereby provide the pattern of second gate conductor material with gate holes therein.

10. In a method of making a field emission device with emitter wells from a multi-layered structure having a first gate conductor layer overlying a dielectric layer, the improvement comprising the step of providing a second gate conductor layer with gate holes therein overlying the first gate conductor layer prior to a step of etching through into the first gate conductor layer and into the dielectric layer to complete said gate holes and form said emitter wells.

* * * * *